United States Patent [19]
Takami et al.

[11] Patent Number: 5,912,462
[45] Date of Patent: Jun. 15, 1999

[54] ELECTRON MICROSCOPE

[75] Inventors: Sho Takami; Tadashi Otaka, both of Hitachinaka, Japan

[73] Assignee: Hitachi, Ltd., Tokyo, Japan

[21] Appl. No.: 08/692,291

[22] Filed: Aug. 2, 1996

[30] Foreign Application Priority Data

Aug. 7, 1995 [JP] Japan .................................. 7-200776

[51] Int. Cl.⁶ .............................................. H01J 37/29
[52] U.S. Cl. ........................................ 250/310; 250/307
[58] Field of Search .................................. 250/309, 307, 250/310, 397

[56] References Cited

U.S. PATENT DOCUMENTS

| | | | |
|---|---|---|---|
| 4,189,641 | 2/1980 | Katagiri et al. | 250/311 |
| 4,581,318 | 4/1986 | Lee | 430/270 |
| 4,697,080 | 9/1987 | King | 250/310 |
| 4,743,767 | 5/1988 | Plumb et al. | 250/398 |
| 4,751,384 | 6/1988 | Murakoshi et al. | 250/310 |
| 4,751,393 | 6/1988 | Corey et al. | 250/492.21 |
| 4,767,926 | 8/1988 | Murakoshi et al. | 250/310 |
| 4,849,641 | 7/1989 | Berkowitz | 250/397 |

OTHER PUBLICATIONS

Patent Abstracts of Japan, vol. 6, No. 111, Jun. 22, 1982 & JP 57–040843 (Jeol Ltd.), Mar. 6, 1982.
Patent Abstracts of Japan, vol. 7, No. 247, Nov. 2, 1983 & JP 58–133749 (Nippon Denshi KK), Aug. 9, 1983.
Patent Abstracts of Japan, vol. 18, No. 672, Dec. 19, 1984 & JP 06–267467 (Hitachi Ltd.), Sep. 22, 1994.
Semiconductor World 1985, 8, pp. 102–114.
LSI Testing Technology, pp. 285–303, Dec. 25, 1986, published by Torikepps.

*Primary Examiner*—Bruce Anderson
*Attorney, Agent, or Firm*—Kenyon & Kenyon

[57] ABSTRACT

In the electron microscope, a degree of sample contamination caused by irradiating electron beams to a sample can be suppressed to an allowable range. The electron microscope is comprised of: means for directly measuring an electron beam irradiation current to a sample; time measuring means for measuring irradiation time of electron beams to an observation region on the sample; and means for calculating a dose of the electron beams irradiated to the observation region based upon the measured electron beam irradiation current, the measured electron beam irradiation time, and preset observation magnification.

8 Claims, 7 Drawing Sheets

ELECTRON MICROSCOPE

BACKGROUND OF THE INVENTION

The present invention relates to an electron microscope, and more particularly to an electron microscope equipped with a means capable of suitably preventing sample contamination.

To measure pattern widths of very fine processed products such as semiconductor devices and to investigate outer views of these processed products, electron microscopes such as scanning type electron microscopes are used. When these very fine processed products (will be referred to "samples" hereinafter) are irradiated by electron beams, sample contamination will occur. This sample contamination may be caused by such a phenomenon that gas emitted from the sample, or a very small amount of $CO_2$ and $H_2O$ existing in an atmosphere adjacent the sample is decomposed/recombined by receiving electron beams, and thus the gas will be converted into a carbon film and a hydrocarbon film, which are deposited on the surfaces of this sample. There is a risk that when the sample contamination caused by the electron beam irradiation occurs on, for instance, a photoresist pattern during a manufacturing stage of a semiconductor integrated circuit, this sample contamination may cause problems in the subsequent manufacturing stages such as the exposing stage and the etching stage, resulting in defective integrated circuits. Also, since the outer shape of the pattern to be microscopically observed would be varied due to this sample contamination, there is another problem that the incorrect measurement values would be acquired.

To avoid this sample contamination, otherwise to suppress adverse influences caused by the sample contamination within such a range where the manufacturing process could not be damaged, the irradiation amount of the electron beams (will be referred to as a "dose of irradiation" hereinafter) expressed by the following formula (1) must be suppressed to the minimum irradiation amount:

$$\text{Dose of Irradiation} = \text{Irradiation current per unit area} \times \text{Irradiation time} \quad (1)$$

Conventionally, in order to reduce an irradiation dose, various methods have been employed as reported in Semiconductor World 1985, 8, page 107. That is, unnecessary beam irradiation is avoided by employing the beam blanking operation, or the S/N (signal-to-noise ratio) is improved by way of the image processing operation to thereby produce the images having high image qualities under less irradiation dose. Further, in the latest electron microscope having the pattern width measuring function, the visual field selection, the image adjustment, and the length measurement are controlled by the CPU with employment of the image processing technique, so that the dose of irradiation could be minimized.

On the other hand, in the case that the microscopic image is manually adjusted by the operator, or the electron microscope is used as the outer view inspection apparatus, the irradiation dose is actually lowered in such a manner that the irradiation current is reduced while the S/N is not deteriorated. As a consequence, no specific consideration is made of the area into which the electron beams are irradiated, and also of the irradiation time.

SUMMARY OF THE INVENTION

An object of the present invention is to provide an electron microscope having a function used to manage a dose of irradiation so as to minimize sample contamination even in such a case that a visual field selection, an image adjustment, and an outer view inspection are manually performed by an operator.

To achieve the above-described object, an electron microscope, according to a first aspect of the present invention, is featured by comprising: means for directly measuring an electron beam irradiation current to a sample; time measuring means for measuring irradiation time of electron beams to an observation region on said sample; and means for calculating a dose of the electron beams irradiated to said observation region based upon said measured electron beam irradiation current, said measured electron beam irradiation time, and preset observation magnification.

The above-described electron microscope may further comprises means for sequentially displaying the calculated dose of the electron beams, means for registering therein a reference dose of electron beams, and means for comparing the registered dose of the electron beams with said dose of the electron beams irradiated to the observation region on the sample to sequentially displaying the comparison results. As to an indication of the irradiation dose, the numeral value may be directly displayed. Preferably, the numeral value thereof may be displayed as a ratio thereof to the reference amount. As to registering of the irradiation dose, the absolute value thereof may be directly inputted. Alternatively, a set of parameters such as a probe current, magnification, and irradiation time may be inputted.

Also, the electron microscope may comprises means for interrupting the electron beam irradiation to the sample when the dose of the electron beams irradiated to the observation region on the sample exceeds said registered electron beam dose.

Otherwise, the above-described electron microscope may comprises means for registering therein a reference electron beam dose; and means for calculating allowable time when said dose of the electron beams irradiated to the observation region on the sample reaches said registered electron beam dose based upon said measured electron beam irradiation current and said preset observation magnification. In this case, it is preferable to comprise means for comparing said allowable time calculated from said registered electron beam dose with said electron beam irradiation time measured by said time measuring means to sequentially display the comparison result.

Also, an electron microscope, according to a second aspect of the present invention, is featured by comprising means for directly measuring an electron beam irradiation current to a sample; time measuring means for measuring irradiation time of electron beams to an observation region on said sample; means for registering therein reference electron beam irradiation time and observation magnifying power; and means for comparing said registered electron beam irradiation time with the electron beam irradiation time measured by said time measuring means to sequentially display the comparison result.

Also, an electron microscope, according to a third aspect of the present invention, is featured by comprising means for directly measuring an electron beam irradiation current to a sample; time measuring means for measuring irradiation time of electron beams to an observation region on said sample; means for registering therein reference electron beam irradiation time and observation magnifying power; and means for interrupting irradiation of the electron beams to the sample when the electron beam irradiation time measured by said time measuring means exceeds said registered reference electron beam irradiation time.

In accordance with the present invention, since the dose of the electron beams irradiated to the microscopic observation region on the sample is sequentially calculated based upon the actual electron beam irradiation line, the preset magnification, and the irradiation time, the irradiation dose can be correctly grasped. Also, since the irradiation dose is displayed, the operator can grasp the actual irradiation dose, namely degrees of the sample contamination. When the actual irradiation dose exceeds the limit value of the irradiation dose, the operator can interrupt, or stop the irradiation of electron beams to the sample.

When the irradiation dose allowable to the sample is employed as the irradiation dose to be registered, since the relationship between the actual irradiation dose and the allowable irradiation dose can be recognized from the indications, the operator can determine such a timing at which the electron beam irradiation is stopped, namely a timing when the microscopic observation is stopped.

An irradiation dose allowable to a certain sample will differ from each other, depending upon a material of this sample, and a process history thereof. However, this allowable irradiation dose may be determined by the following experimental manner. That is, while an article constructed on this sample, for example, a resist pattern is irradiated by a preselected probe current (e.g., 2 pA), this constructed article is microscopically and continuously observed in predetermined magnification such as 10,000 times. While continuing this microscopic observation, for example, the width of the resist pattern is gradually widened with an elapse of time due to the above-described sample contamination, which can be microscopically observed. Assuming now that the width of the resist pattern at the beginning of observation is "d", and also an allowable increased amount of this resist pattern is "Δd", irradiation time "T" defined by that the pattern width is increased from "d" to "d+Δd" is measured. In other words, the allowable increased amount "Δd" of the pattern width is calculated in advance by the experimental step in such a manner that after the dimension thereof is measured by way of the electron beams, this increased amount gives completely no adverse influence to the process such as the etching treatment. Subsequently, the irradiation time T until the measured dimension reaches this increased amount "Δd" is measured.

The irradiation dose allowable to this sample can be obtained from these probe current, magnification, and irradiation time. Thus, this allowable irradiation dose may be commonly utilized with respect to a plurality of samples which own the same structures and have been processed in the same manner to that of the first-mentioned samples.

In such a case that the electron microscope is constructed of the mechanism capable of automatically stop the electron beam irradiation when the irradiation dose of the observation region reaches the registered irradiation dose, if the irradiation dose allowable to this sample is employed as the irradiation dose to be registered, then the degree of sample contamination can be suppressed to the allowable degree.

When the comparison between the registered irradiation dose and the present irradiation dose is indicated as the elapsed irradiation time, or the remaining irradiation time with respect to the allowable beam irradiation time, the operator can intuitionally grasp such a timing at which the electron beam irradiation is stopped in the form of concrete amounts, namely microscopic observation time.

In the case that the irradiation current and the observation magnification are determined, since the irradiation dose can be managed based on the irradiation time, if the irradiation time allowable to the sample is employed as the amount to be registered instead of the irradiation dose itself, then a similar effect can be achieved by merely comparing the registered irradiation time with the actual irradiation time, while omitting such a cumbersome calculation work of the irradiation dose.

DESCRIPTION OF THE PREFERRED EMBODIMENTS

Referring now to drawings, electron microscopes according to various embodiments of the present invention will be described.

Figure 1:
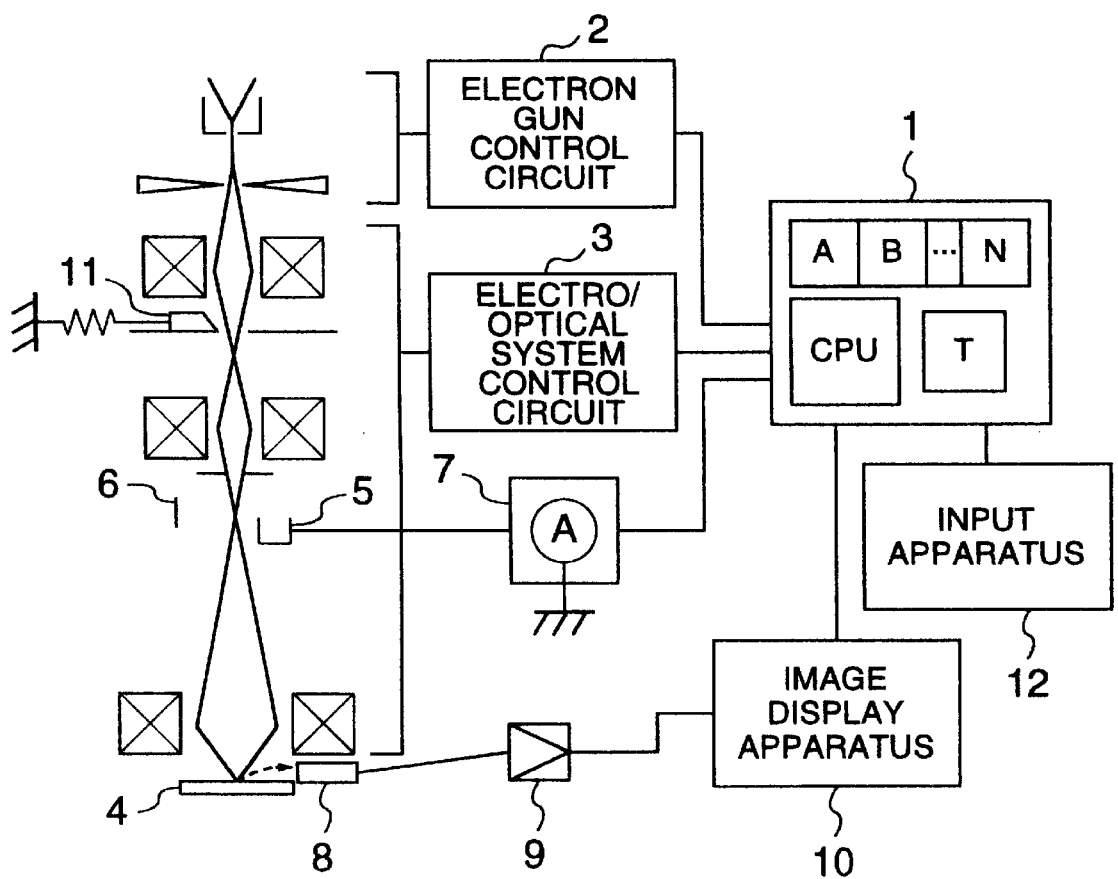
FIG. 1 is a schematic diagram for representing an electron microscope according to the present invention.

FIG. 1 schematically shows a structural diagram of an electron microscope according to the present invention. In FIG. 1, a control of electron beams is carried out by way of a control unit 1 equipped with memories "A" to "N", a timer "T" and a CPU via an electron gun control circuit 2, an electron optical system control circuit 3 and the like. This electron beam control is defined by, for instance, measuring and increasing/decreasing an irradiation current; by managing irradiation time; by managing magnification (magnifying power); by controlling a focus; and by controlling beam blanking operation. In the memories "A" to "N", a plurality of arbitrary doses, a plurality of irradiation time, and also a plurality of observation magnification may be registered as reference values. The timer T counts up the irradiation time. The CPU performs the calculations of the dose and the irradiation time, and further the comparison of calculation results.

Various setting values and various data are entered from an input apparatus 12 connected to the control unit 1. To measure an irradiation current supplied to a sample 4, a Faraday cup 5 is provided. The irradiation current to the sample may be measured by a current detecting circuit 7 by applying a voltage to a deflection electrode 6 and by irradiating all of the electron beams to the Faraday cup 5. These electron beams are to be irradiated to the sample 4. The deflection electrode 6 is also utilized as a beam blanking means for interrupting the irradiation of electron beams to the sample. As a consequence, this deflection electrode 6 may be realized by not only an electrostatic type deflection electrode, but also an electromagnetic deflection coil. Further, the beam deflecting means may be substituted by such a mechanism as a vacuum interrupting valve 11 as the beam blanking means. A signal such as secondary electrons produced from the sample is detected by a detecting unit 8, and then amplified by an amplifying unit 9. Thereafter, the amplified signal is displayed on an image display apparatus 10 as an image. Also, a dose of radiation and irradiation time produced by the control unit 1 are displayed on this image display apparatus 10. These data may be displayed on an operation display apparatus capable of display an operation screen, instead of the image display apparatus 10 for exclusively displaying an image.

Figure 2:
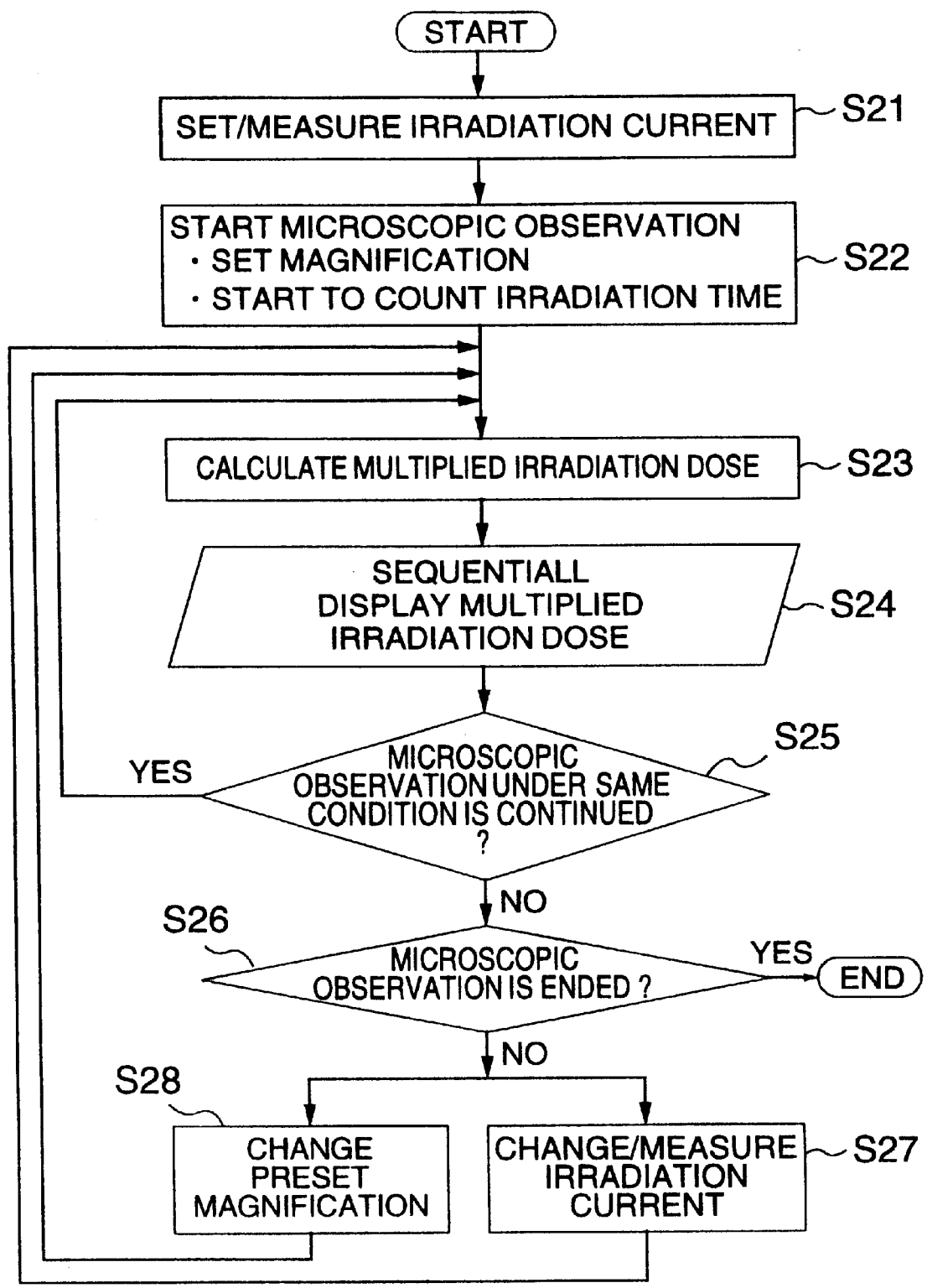
FIG. 2 is a flow chart for describing sequential operation for calculating/indicating a dose of radiation.

Referring now to a flow chart of FIG. 2, a description will be made of functions/operating system of the electron microscope shown in FIG. 1, according to an embodiment of the present invention. In this flow chart, while a voltage is applied to the deflection electrode 6 and all of the electron beams are irradiated to the Faraday cup 5 so as to measure an irradiation current (step S21), the electron gun control circuit 2 is controlled by the CPU of the control unit 1 in such a manner that the irradiation current is set to a desirable value. Subsequently, an observation visual field is set, and magnification (magnifying power) is set to commence the microscopic observation (step S22). At the same time when the microscopic observation is commenced, the timer T starts its counting operation of the irradiation. The CPU calculates a dose of irradiation based upon the measured irradiation current, the set magnification, and the counted irradiation time (step S23). Then, the CPU sequentially displays the calculation results on the image display apparatus 10 (S24).

When the microscopic observation is continued under the same condition (namely, YES at step S25), the microscopic observations defined at steps S23 and S24 are repeated. When the microscopic observation is not complete, but the observation condition is changed, the irradiation current is varied (step S27) and the set magnification is changed (step S28), if required.

Also, in the above-described cases, the dose calculations are continuously executed with employment of the varied parameters, and the multiplied doses of radiation are sequentially displayed. It should be noted that when the irradiation is changed, the Faraday cup 5 is employed so as to again measure a irradiation current, and then this measured irradiation current value is utilized in the radiation dose calculation.

In a case of a scanning (type) electron microscope, it is now assumed that, for instance, the irradiation current is set to 2 pA, and the magnification is set to 10,000 times. Assuming now that a dimension of a display portion of the image display apparatus 10 is 200 mm×200 mm, an irradiation area of electron beams becomes 20 $\mu$m×20 $\mu$m. Now, if 20 msec is required in order to scan a single screen, then the irradiation area of electron beams per 1 sec is approximately 20 $\mu$m×20 $\mu$m×50=20,000 $\mu$m$^2$. The dose of radiation is equal to (2 pA/20,000 $\mu$m$^2$)×irradiation time (sec) based on the formula (1).

Next, when the set magnification is changed into 20,000 magnification times, the irradiation area of electron beams becomes 10 $\mu$m×10 $\mu$m, and the electron beam irradiation area per 1 sec is approximately 10 $\mu$m×10 $\mu$m×10 $\mu$m×50= 5,000 $\mu$m$^2$ similar to the above-described case. At this time, the dose of irradiation becomes (2 pA/5,000 $\mu$m$^2$)× irradiation time (sec) based upon the formula (1). At this time, the multiplied irradiation dose is equal to such a value defined by adding the multiplied irradiation dose obtained under 20,000 magnification times to the multiplied irradiation dose obtained under 10,000 magnification times. These calculations are carried out by the CPU 1 and then are displayed on the image display apparatus 10.

Even when the irradiation current is changed, the dose of irradiation is calculated based on the formula (1), and then such a value obtained by adding the dose after the irradiation current is changed to the dose before the irradiation current is changed is displayed as a multiplied irradiation dose. As described above, even when the magnification and the irradiation current are changed, the multiplied irradiation doses of the portion to which the electron beams are irradiated can be continuously calculated, and then the multiplied irradiation doses are sequentially displayed in a proper time interval. As a consequence, the operator can recognize the proper timing at which the irradiation of electron beams must be interrupted based upon the known relationship between the sample contamination and the dose of irradiation.

Generally speaking, in an electron microscope, a visual field is searched in low magnification, and then the magnification is gradually increased, and thereafter a microscopic observation and also a microscopic length measurement are performed in high magnification. Then, as easily understood from the above-described calculations, since an irradiation area of electron beams is large in low magnification, irradiation dose per unit area is low. Therefore, a timing when a multiplied irradiation dose may be set as follows. For example, the dose calculation may be commenced in magnification higher than 5,000 times.

Figure 3:
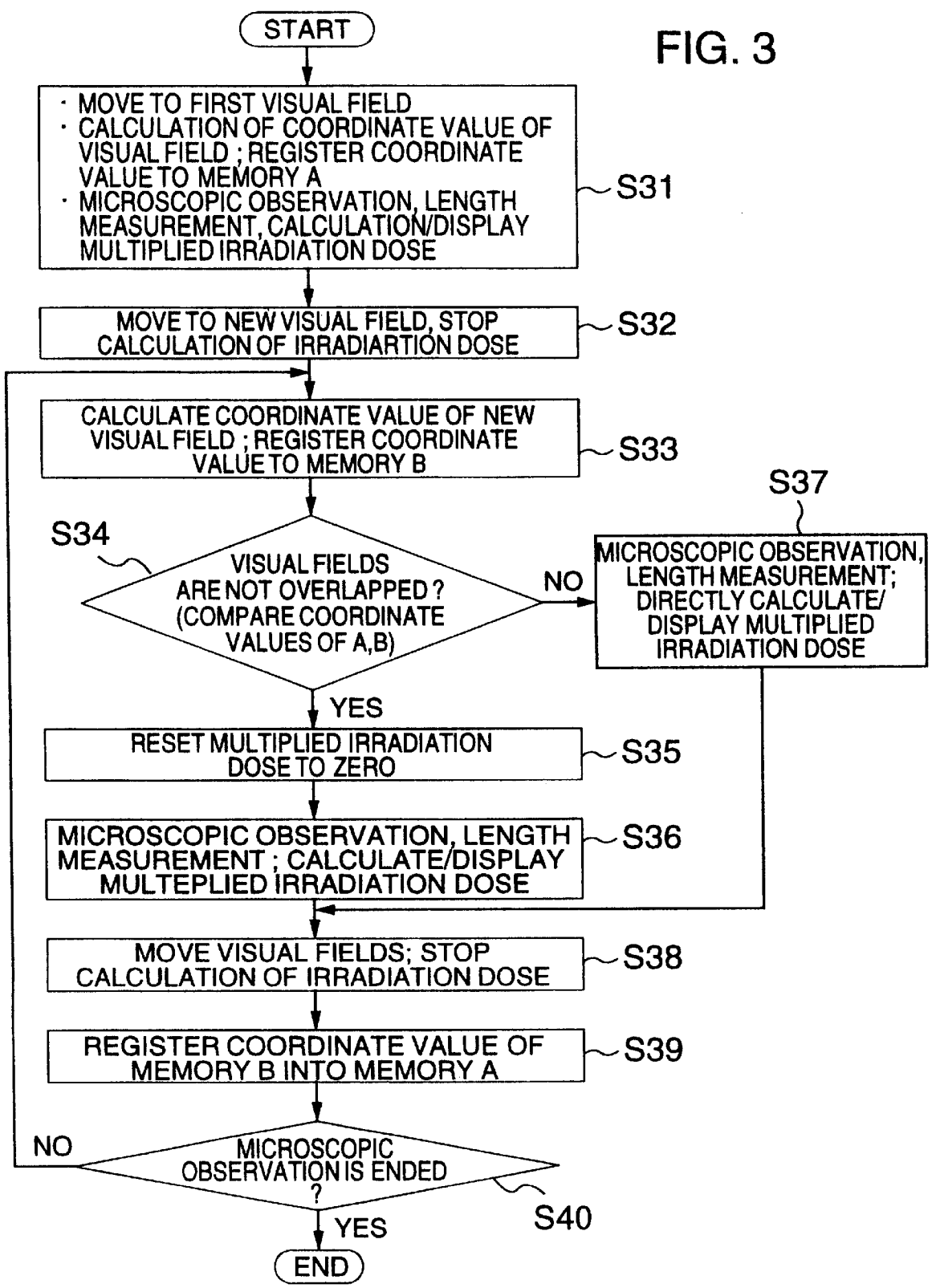
FIG. 3 is a flow chart for describing an example of a dose calculation in the case that a visual field is varied.

In an electron microscope including a means for detecting a stage position and a beam shift amount, when the present visual field is completely changed into a new visual field, such a method is conceivable in which a multiplied irradiation dose is reset to 0, and an irradiation dose for this new visual field is newly calculated. FIG. 3 represent another embodiment with respect to a method for calculating an irradiation dose when the present visual field is changed.

Figure 4:
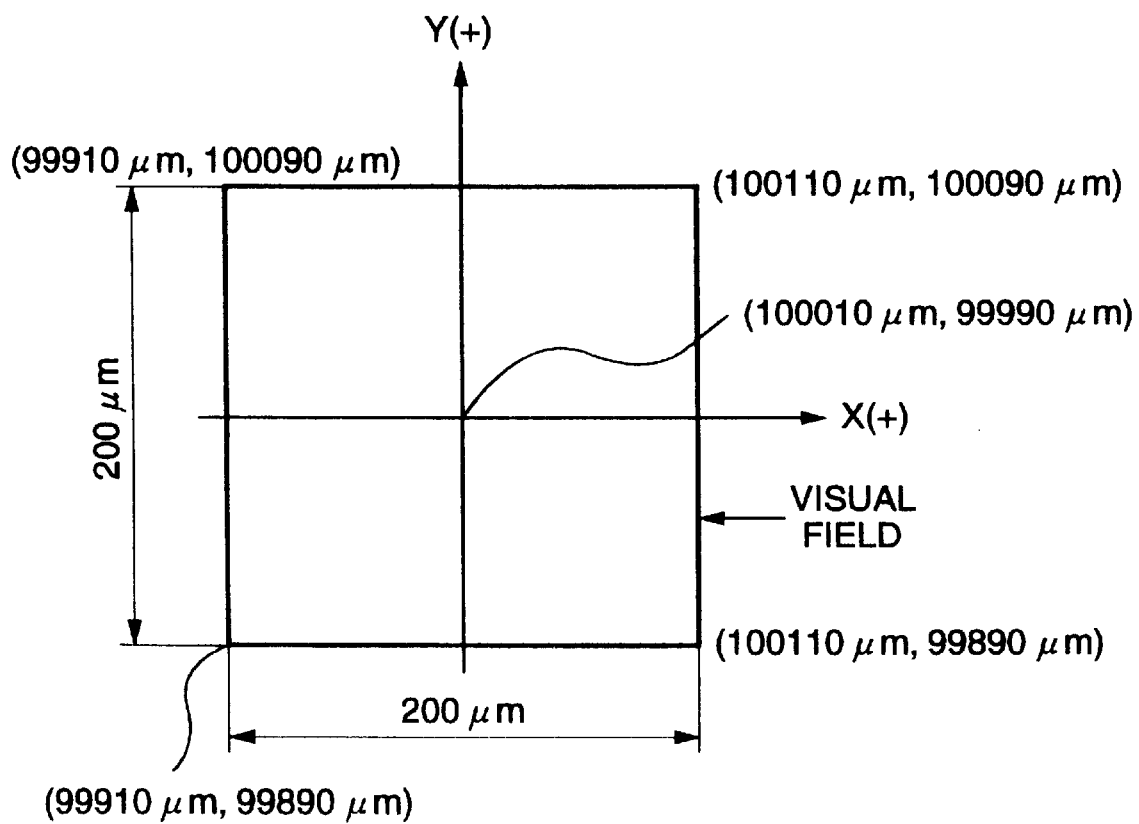
FIG. 4 is an explanatory diagram for explaining a coordinate system of the visual field.

Referring now to a flow operation shown in FIG. 3, the stage is transported to a first microscopic observation position, and a coordinate value of this visual field is calculated, and thereafter the calculated coordinate value is registered into the memory A. For example, as shown in FIG. 4, assuming now that the stage coordinate value of the visual field where the microscopic observation and the microscopic length measurement are carried out at present is defined by (X, Y)=(100,000 $\mu$m;100,000 $\mu$m), and the beam shift value is defined by (X, Y)=(10 $\mu$m, −10 $\mu$m), a coordinate value of a visual field center converted into the stage coordinate value may be defined by (X, Y)=(100,000+ 10 $\mu$m, 100,000−10 $\mu$m)=(100,010 $\mu$m, 99,990 $\mu$m).

Also, assuming now that the magnification is selected to be 10,000 times, a length of one edge of the visual field onto which the electron beams are irradiated is equal to 200 $\mu$m, if the above-described case is effective, so that coordinate values of four corners of the visual field which are converted into the stage coordinate values are given as (99,910 $\mu$m; 100,090 $\mu$m), (100,110 $\mu$m ; 100,090 $\mu$m), (99,910 $\mu$m 99,890 $\mu$m), and (100,110 $\mu$m ; 99,890 $\mu$m), respectively. Then, the sample is microscopically observed and the length is microscopically measured in this visual field, and further a calculation is made of a multiplied irradiation dose in a similar manner to the case of FIG. 2. Thus, the calculated irradiation dose is displayed (step S31).

Next, when the stage is moved to change the observation visual field, the calculation of the irradiation dose is temporarily stopped (step S32). Based upon the stage coordinate value, the beam shift amount, and the magnification, a calculation is made of coordinate values of four corners of the changed visual field, which are converted into the stage coordinate values in a similar manner to the above-explained calculation. Then, the calculated coordinate values are registered in the memory B (step S33). Subsequently, the coordinate values registered into the memory A are compared with those registered into the memory B (step S34). As a result, if all of the coordinate values of the four corners registered into the memory B are not entered into the coordinate values of the four corners of the visual field before the stage is moved, which have been registered in the memory A, then it can be judged that this visual field corresponds to such a new visual field where no visual field is overlapped with each other. Therefore, the multiplied irradiation amount is reset (step S35), and an irradiation dose in the new visual field is calculated, and then the multiplication is commenced from 0, and further the multiplied result is displayed (step S37). In the case that the visual field is again moved, the calculation about the irradiation amount is temporarily stopped (step S38), and the coordinate values of the memory B are transferred to the memory A (step S39). In addition, coordinate values of the new visual field are calculated and the calculated coordinate values are registered into the memory B except for ending of this irradiation dose calculation (step S33). Subsequently, a similar sequential operation is repeated.

By doing so, even when the visual field is changed, it is possible to acquire the multiplied irradiation dose with respect to this changed visual field. Conversely, when it is judged that the visual fields are overlapped with each other, the irradiation dose is not reset to 0, but the multiplied irradiation dose is still calculated.

FIG. 3 represents such an embodiment is which the coordinate values before/after the visual field is changed are stored. Alternatively, if the coordinate values of all visual fields where the microscopic observation and the microscopic length measurement are carried out, and furthermore the multiplied irradiation doses corresponding to these coordinate values are previously stored in the memories A to N of the control unit 1, then the correct irradiation dose in the relevant visual field may be acquired by adding then to the previously calculated multiplied irradiation dose to calculate the multiplied irradiation dose in such a case that the microscopic length measurement are carried out plural times in the same visual field.

With respect to a sample, for example, an integrated circuit whose microscopic observation and microscopic length measurement have been accomplished, a chip whose irradiation dose is large is investigated, and then this chip is not used as a final product, resulting in increasing of yield as well as reliability.

Figure 5:
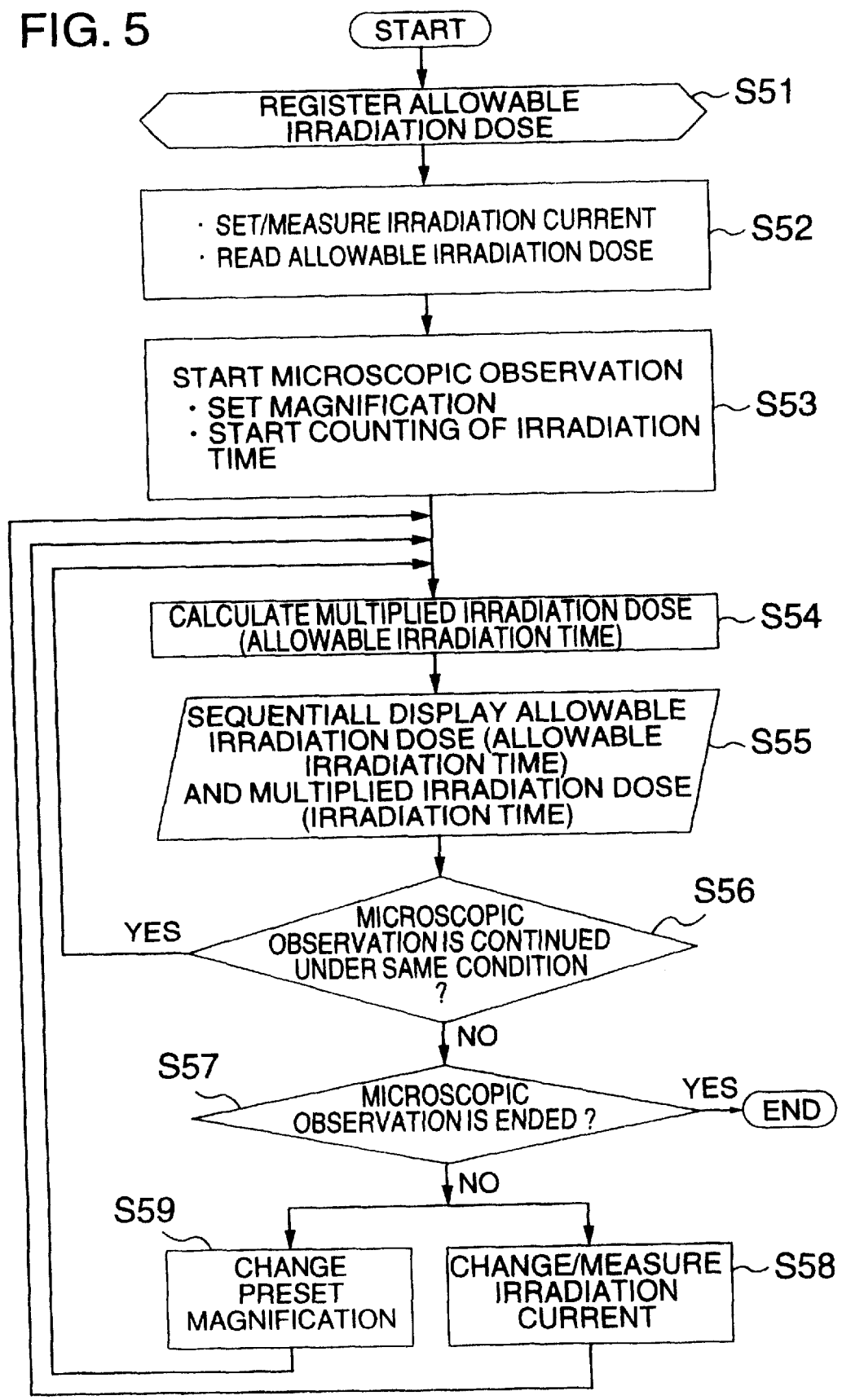
FIG. 5 is a flow chart for describing sequential operation for calculating/indicating a dose of radiation, or irradiation time.

FIG. 5 is a flow chart for explaining another embodiment of the present invention. A reference dose of irradiation is registered into empty memories A to N in the control unit 1 (step S51). For instance, there are differences in degrees of sample contamination with respect to irradiation doses, depending upon sorts of photoresists coated on surfaces of samples. Accordingly, if the allowable irradiation doses are registered with respect to each sort of a photoresist, then the reference irradiation doses are saved in the apparatus in correspondence with the respective photoresists. When the sample is microscopically observed, either the operator or another CPU having a higher grade than the above-described CPU selects the sort of this sample, so that the irradiation dose allowable to the sample under microscopic observation can be read out (step S52). On the other hand, when the microscopic observation is commenced and then the electron beams are irradiated to the sample under a certain irradiation current and present magnification, the multiplied irradiation dose is calculated and displayed in a similar manner as previously explained with respect to FIG. 2 (step S53 to S55). Thereafter, when this microscopic observation is continued under the same condition ("YES" at step S56), the microscopic observation defined at steps S54 and S55 is repeated. In the case that the microscopic observation is not accomplished ("NO" at step S56), but the observation condition is changed, the irradiation current is changed (step S58), and the preset magnification is changed (step S59), if required.

The multiplied irradiation doses calculated by the microscopic observation of this sample are sequentially displayed near the registered irradiation dose on a display unit such as the image display apparatus 10. As a result, the operator can readily recognize from this display as to whether or not the irradiation dose multiplied during the microscopic observation is larger than the allowable irradiation dose. If the multiplied irradiation dose becomes larger than the allowable irradiation dose, then the operator can interrupt the electron beam irradiation. As a result, since the electron beams are not excessively irradiated, the sample contamination can be suppressed within the allowable contamination range.

As to the irradiation dose indication method, not only the numeral value of the irradiation dose may be directly indicated, but also other dose indication methods may be employed. For instance, as shown in FIG. 6, a ratio indication may be made under such a condition that the registered irradiation dose is set to 100% in order that a ratio of the actually multiplied irradiation dose to the registered irradiation dose can be immediately grasped.

Figure 6:
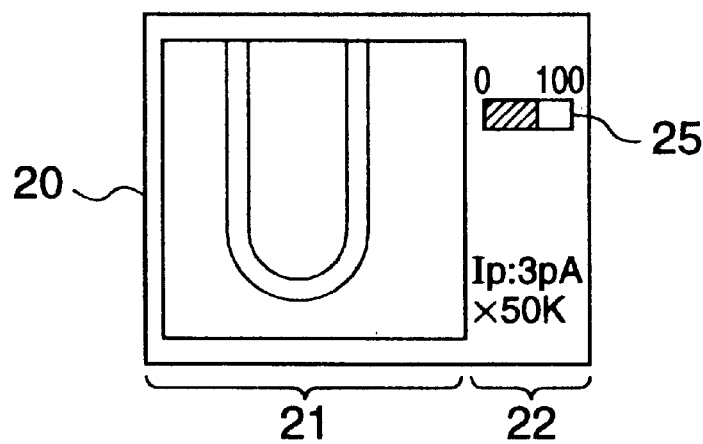
FIG. 6 schematically shows an example of a dose indicating method.

FIG. 6 schematically represents such an sample that a display screen 20 of the image display apparatus 10 is subdivided into an image display unit 21 and a data display unit 22. An enlarged image of a sample is displayed on the image display unit 21, whereas various information such as a value of an irradiation current and magnification is displayed on the data display unit 22. A graphic representation 25 is made in a portion of this data display unit 22 as a ratio of a present multiplied irradiation dose to a present allowable irradiation dose 100. A hatched portion of the graphic representation 25 indicates the actual multiplied irradiation dose, and the area of this hatched portion is successively increased in connection with increasing of the multiplied irradiation dose.

Figure 7:
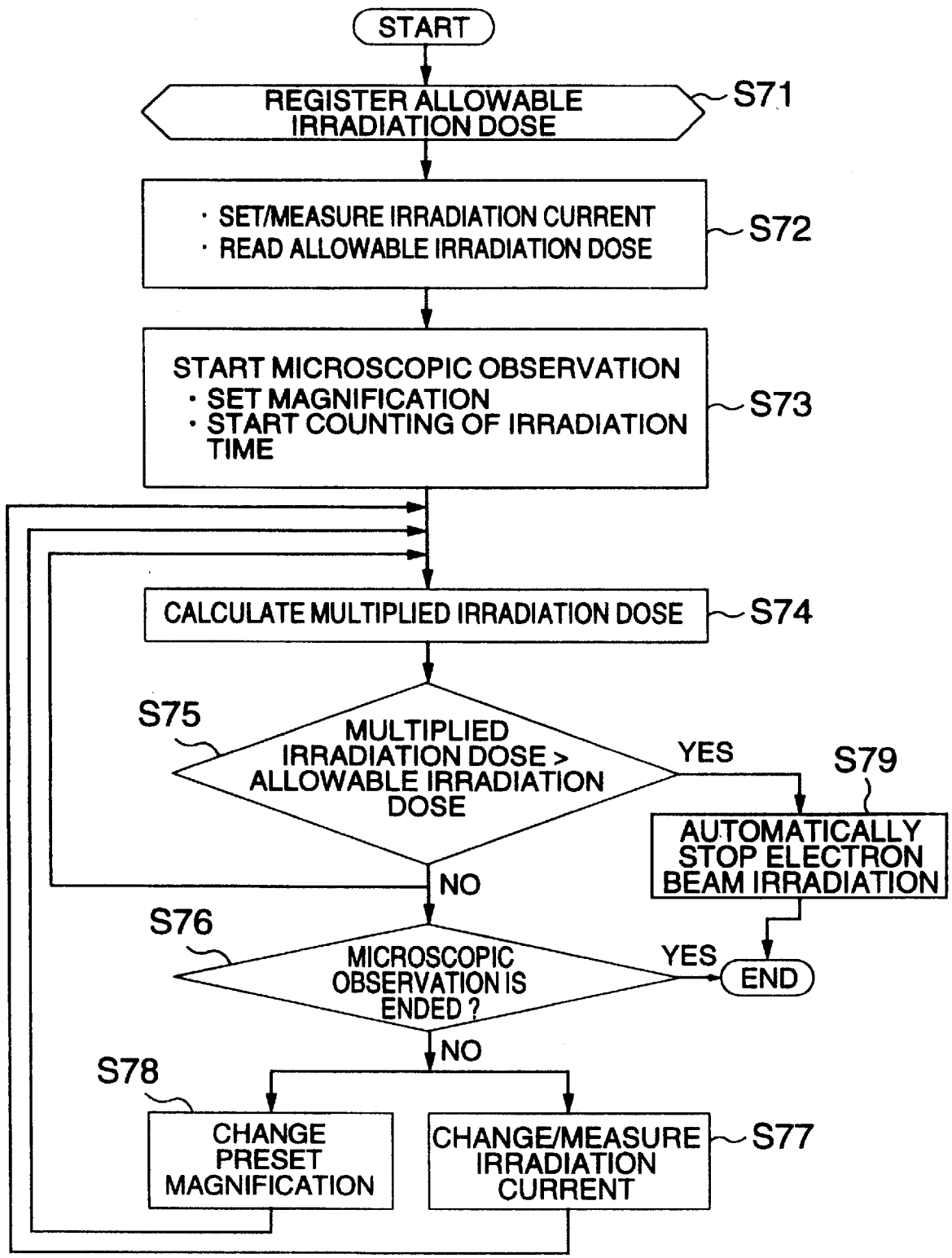
FIG. 7 is a flow chart for explaining operation for interrupting irradiation of electron beams when the dose of radiation exceeds an allowable amount, according to an embodiment of the present invention.

FIG. 7 is a flow chart for explaining another embodiment of the present invention. In this embodiment, irradiation doses allowable to the respective samples are registered into empty memories A to N (step S71). When a sample is microscopically observed, either an operator or another CPU having a higher grade than the above-described CPU reads out the allowable irradiation dose corresponding to this observed sample from the memories A to N (step S72). Then, similar to the above-described embodiment, a multiplied irradiation dose is calculated (steps S73 and S74), and the actual multiplied irradiation dose is compared/calculated with the allowable irradiation dose by the CPU (step S75). As a result of this comparison operation, when it can be judged that the actual multiplied irradiation dose exceeds the registered irradiation dose, the blanking operation is carried out in order that the voltage is applied to the deflection electrode 6 not to irradiate the electron beams to the sample (step S79). In the case that the irradiation current is changed (step S77), or the preset magnification is changed (step S78) while executing the microscopic observation, except for such a case that this microscopic observation is accomplished (step S76), the calculation of the multiplied irradiation dose is continued by reflecting the changed value onto this calculation in a similar manner to that as previously explained in FIG. 2.

In accordance with this embodiment, since the electron beam irradiation to the sample can be automatically stopped by utilizing the comparison result, the degree of the sample contamination caused by the electron beams can be suppressed to a predetermined allowable range. In particular, when the magnification is increased, the irradiation dose would be rapidly increased. As a consequence, according to this embodiment, it is firmly possible to avoid such a difficulty that the electron beams are excessively irradiated to the sample, as compared with such a condition that the operator manually interrupts the electron beam irradiation.

Referring again to FIG. 5, a description will now be made of a further embodiment of the present invention. In this embodiment, a dose of irradiation is converted into irradiation time which will then be displayed. As previously explained, the irradiation doses allowable to the respective samples are registered into the apparatus (step S51). For example, it is assumed that a registered irradiation dose of a sample "S" is "X". This "X" is selected by either the operator or another CPU having a higher grade than the above-described CPU, and then is brought into a calculatable condition by the last-mentioned CPU (step S52). Since the irradiation time corresponding to the registered irradiation may be expressed by the below-mentioned formula (2) obtained by modifying the formula (1), this allowable irradiation time is calculated at a step S54.

$$\text{Irradiation time} = \text{Irradiation dose}/\text{Irradiation current per unit area} \quad (2).$$

It is now assumed that the irradiation current is set to 2 pA at a step S52, and the magnification is set to 10,000 times at a step S53. Also, if the dimension of the display screen of the image display apparatus 10 is 200 mm×200 mm, then the irradiation current per unit area becomes (2 pA/20,000 $\mu m^2$). The irradiation time $T_2$ allowable to the sample S is calculated as $T_1 = X/(2 \text{ pA}/20,000 \mu m^2)$ sec from the formula (2). This $T_1$ constitutes the allowable irradiation time under conditions such that the irradiation current is 2 pA, and the magnification is 10,000 times.

Figure 8:
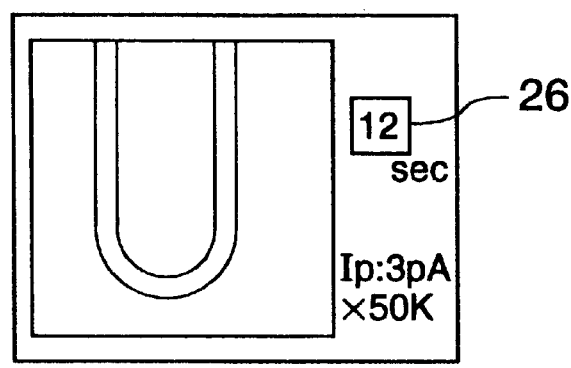
FIG. 8 schematically represents an example of an irradiation time indication.
Figure 9:
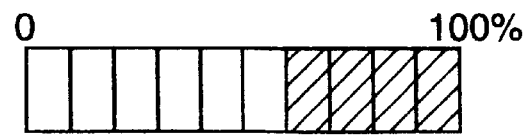
FIG. 9 schematically illustrates another example of the irradiation time indication.

This allowable irradiation time $T_1$ and also the actual irradiation time "t" are displayed in a close location on the image display apparatus 10 (step S55), so that the operator can recognize how long the microscopic observation time is still left, which may give a scale of working. Also, if the actual irradiation time "t" exceeds this allowable irradiation time $T_1$, then the operator can interrupt the electron beam irradiation, so that the degree of sample contamination can be suppressed within the allowable range. As indicated in FIG. 8, a numeral value indication portion 26 is formed in the image display apparatus 10. The remaining time capable of irradiating the electron beams, namely ($T_1$-t) may be directly indicated in the numeral value display portion 26 in the numeral value. Alternatively, as represented in FIG. 9, assuming now that the allowable irradiation time is set 100%, the remaining time may be displayed in a ratio.

In this embodiment, another explanation will now be made of such a case that the preset magnification is changed (step S57). Assuming now that the microscopic observation magnification is changed to 20,000 times under the actual irradiation time $t_1$, an irradiation dose "$X_1$" up to the actual irradiation time $t_1$ becomes $X_1=(2 \text{ pA}/20,000 \mu m^2) \times t_1$ based upon the formula (1), whereas an allowable remaining irradiation dose $X_2$ becomes $X_2=X-X_1$. As the magnification is changed into 20,000 times, the irradiation current/unit area becomes (2 pA/5,000 $\mu m^2$). The allowable irradiation time $T_2$ after the magnification has been changed into 20,000 times is given as $T_2=X_2/(2 \text{ pA}/5,000 \mu m^2)$ sec based on the formula (2). Similar to the above embodiment, this allowable irradiation time $T_2$, the actual irradiation time after the magnification becomes 20,000 times, and the remaining time ($T_2$-t) capable of irradiating the electron beams are displayed on the image display apparatus 10. As a consequence, the operator can recognize an elapse of microscopic observation time, and also can interrupt the electron beam irradiation within such a range that the degree of the sample contamination is allowable.

Even when the irradiation current is varied (step S56), the allowable irradiation time is newly calculated by the formula (2) from the allowable irradiation dose in the CPU 1, and this calculated allowable irradiation time is displayed on the image display apparatus 10, so that since the operator can recognize an elapse of the microscopic observation time, and also the timing at which the electron beam irradiation is interrupted, the degree of sample contamination can be suppressed within the allowable range.

In accordance with another embodiment of the present invention, reference irradiation time and reference microscopic observation magnification, which are allowable for the respective samples, are registered into the CPU 1 and the like. During the microscopic observation, either the operator or another CPU having a higher grade than the above-described CPU 1 selects the sample, and reads the irradiation time corresponding to this selected sample from the registered irradiation times. When the irradiation current is set and the magnification becomes the registered observation magnification, the CPU 1 commences to count the actual irradiation time. Since the registered irradiation times and the actual irradiation times are sequentially displayed on the image display apparatus 10, the operator can recognize the basis of microscopic observation time allowed to irradiate the electron beams. Also, since the electron beam irradiation can be interrupted without exceeding the allowable irradiation time, the degree of the sample contamination can be suppressed within the allowable range. The ratio of the actual irradiation time to the registered irradiation time may be sequentially displayed on the image display apparatus 10. Alternatively, the remaining irradiation time allowable for the microscopic observation, namely, (registered allowable irradiation time—actual irradiation time) may be sequentially displayed on the image display apparatus 10, resulting in a similar effect to the above-described embodiment.

In accordance with a still further embodiment, both irradiation time and microscopic observation magnification are registered which are allowed to each of samples. After the magnification becomes the registered observation magnification, the registered irradiation time is sequentially compared/calculated with the actual irradiation time. For example, when the actual irradiation time exceeds the registered irradiation time, a blanking operation is carried out in such a manner that the voltage is applied to the deflection electrode 6 so as not to irradiate the electron beams to the sample. As described above, the electron beam irradiation to the sample is automatically interrupted based upon the comparison result, so that the degree of the sample contamination caused by the electron beam irradiation can be firmly suppressed within a preselected range.

What is claimed is:

1. A scanning electron microscope having a display apparatus for displaying an image of an irradiated region of a sample irradiated by an electron beam, comprising:

means for scanning of an electron beam onto a sample, means for directly measuring said electron beam irradiating current to said sample;

time measuring means for measuring irradiation time of electron beams to an observation region on said sample; and means for sequentially calculating electron beam dose amount irradiated onto said observation region, based upon said measured electron beam irradiation current, electron beam irradiation time and a preset observation magnification;

wherein said display apparatus is structured to sequentially display said calculated electron beam dose amount with said image of said sample.

2. The scanning electron microscope as claimed in claim 1, further comprising:

means for registering allowable irradiation dose of electron beam as a reference; and means for sequentially displaying said registered allowable irradiation dose in comparison with irradiated electron beam dose on the observation region of said specimen.

3. The scanning electron microscope as claimed in claim 1, further comprising:

means for registering allowable irradiation dose of electron beam as a reference; and means for interrupting the electron beam irradiation to the sample when the dose of the electron beams irradiated to the observation region on the sample exceeds said registered allowable irradiation dose of electron beam.

4. The scanning electron microscope as claimed in claim 1, further comprising:

means for calculating electron beam irradiation area per unit time based upon area of one frame to which electron beam is irradiated known from observation magnification, and number of frames to which electron beam is irradiated per unit time;

means for registering allowable irradiation dose of an electron beam as a reference; and means for calculating an allowable time when said dose of the electron beam irradiated to the observation region on the sample reaches said registered allowable electron beam dose based upon said measured electron beam irradiation current, allowable irradiation dose of electron beam and calculated electron beam irradiation area per unit time according to the following formula;

allowable electron beam irradiation time=(allowable irradiation dose amount)×(electron beam irradiating area per unit time)/(electron beam irradiating current to specimen).

5. The scanning electron microscope according to claim 4, further comprising:

time measuring means for measuring electron beam irradiation time on an observation means on a sample; and means for sequentially displaying said allowable electron beam irradiating time in comparison with measured electron beam irradiation time by said time measuring means.

6. The scanning electron microscope as claimed in claim 1, further comprising:

means for registering therein a reference allowable combination of electron beam irradiation time and observation magnifying power; and means for comparing said registered electron beam irradiation time with the electron beam irradiation time measured by said time measuring means to sequentially display the comparison result.

7. A method for generating an image of an observation region of a sample wherein said sample includes a pattern, comprising the steps of:

scanning an electron beam on the pattern formed on the sample;

determining a measuring time of the width of the pattern which increases along with scanning of the electron beam onto the sample reaches a predetermined allowance; and determining a scanning time of the electron beam based on the result of the measuring time of the width of the pattern.

8. A scanning electron microscope having a display apparatus for displaying an image of an irradiated region of a sample irradiated by an electron beam, comprising:

means for scanning of an electron beam onto a sample;

means for setting an increasing amount of a pattern width formed on the sample; and measuring means for measuring a time for the pattern width which increases along with scanning of the electron beam onto the sample reaches a predetermined allowance;

wherein the scanning time of the electron beam is determined based on the time measured by the measurement means.

* * * * *